US012586629B2

(12) United States Patent　　　(10) Patent No.:　US 12,586,629 B2
Lu et al.　　　　　　　　　　　　(45) Date of Patent:　Mar. 24, 2026

(54) IMPLEMENTING GLOBAL WORDLINE BIAS VOLTAGES FOR READ STATE TRANSITIONS

(71) Applicant: MICRON TECHNOLOGY, INC., Boise, ID (US)

(72) Inventors: Ching-Huang Lu, Fremont, CA (US); Go Shikata, San Jose, CA (US); Gangotree Chakma, Morgan Hill, CA (US)

(73) Assignee: Micron Technology, Inc., Boise, ID (US)

( * ) Notice: Subject to any disclaimer, the term of this patent is extended or adjusted under 35 U.S.C. 154(b) by 156 days.

(21) Appl. No.: 18/402,875

(22) Filed: Jan. 3, 2024

(65) Prior Publication Data

US 2024/0242754 A1　　Jul. 18, 2024

Related U.S. Application Data

(60) Provisional application No. 63/438,954, filed on Jan. 13, 2023.

(51) Int. Cl.
*G11C 11/408*　　　(2006.01)
*G11C 11/4076*　　(2006.01)
*G11C 11/4096*　　(2006.01)

(52) U.S. Cl.
CPC ...... *G11C 11/4085* (2013.01); *G11C 11/4076* (2013.01); *G11C 11/4096* (2013.01)

(58) Field of Classification Search
CPC .................................................. G11C 11/4085
See application file for complete search history.

(56) References Cited

U.S. PATENT DOCUMENTS

2007/0183207 A1* 8/2007 Park ...................... G11C 16/30
　　　　　　　　　　　　　　　　　　　365/185.22
2021/0225425 A1* 7/2021 Do ...................... G11C 11/4085

* cited by examiner

*Primary Examiner* — Hoai V Ho
(74) *Attorney, Agent, or Firm* — Lowenstein Sandler LLP

(57) ABSTRACT

A memory device includes a memory array and control logic, operatively coupled to the memory array, to perform operations including identifying a set of parameters related to the memory device, selecting, based on the set of parameters, a magnitude of a bias voltage to be applied to a global wordline during a read state transition of a block of the memory device from a transient state to a stable state, and causing the bias voltage to be applied to the global wordline.

20 Claims, 10 Drawing Sheets

500

START

Identify a set of parameters
510

Select a magnitude of a bias voltage
520

Apply the bias voltage
530

END

600A

START

Identify a temperature
610A

Select a magnitude of a bias
voltage using a continuous bias
voltage selection method
620A

END

600B

700

PROCESSING DEVICE
702

INSTRUCTIONS
726

GWBV
COMPONENT
137

MAIN MEMORY 704

INSTRUCTIONS
726

GWBV
COMPONENT
137

NETWORK
INTERFACE
DEVICE
708

NETWORK
720

BUS
730

STATIC MEMORY
706

DATA STORAGE SYSTEM
718

MACHINE-READABLE
MEDIUM 724

INSTRUCTIONS
726

GWBV
COMPONENT
137

IMPLEMENTING GLOBAL WORDLINE BIAS VOLTAGES FOR READ STATE TRANSITIONS

CROSS-REFERENCE TO RELATED APPLICATION(S)

The present application claims the benefit of U.S. Provisional Patent Application No. 63/438,954, filed on Jan. 13, 2023 and entitled "IMPLEMENTING GLOBAL WORDLINE BIAS VOLTAGES FOR READ STATE TRANSITIONS", the entire contents of which are hereby incorporated by reference herein.

TECHNICAL FIELD

Embodiments of the disclosure relate generally to memory sub-systems, and more specifically, relate to implementing global wordline bias voltages for read state transitions.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
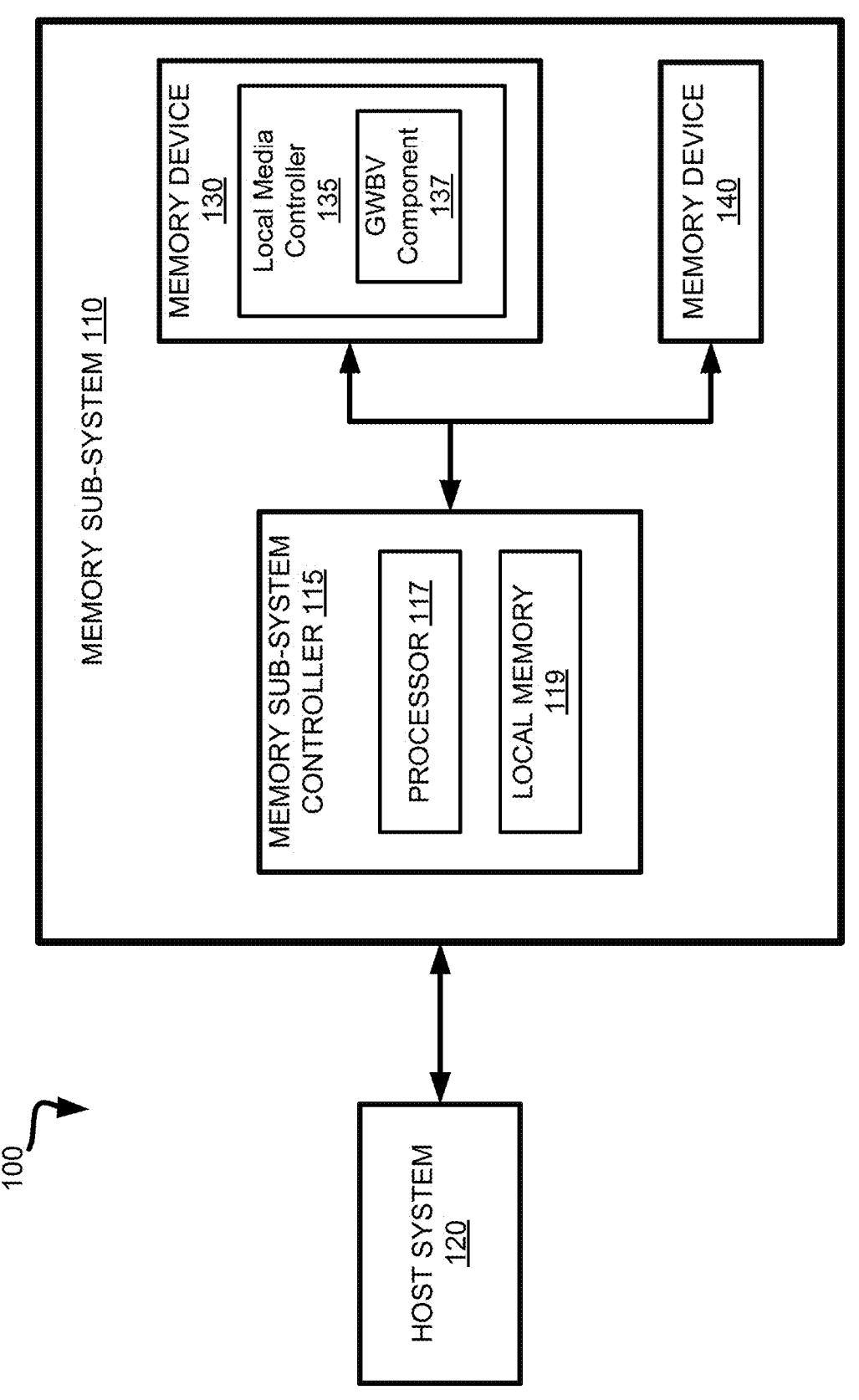
FIG. 1A illustrates an example computing system that includes a memory sub-system, in accordance with some embodiments of the present disclosure.

Aspects of the present disclosure are directed to implementing global wordline bias voltages for read state transitions. A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1A-1B. A non-volatile memory device is a package of one or more dies. Each die includes one or more planes. For some types of non-volatile memory devices (e.g., NAND devices), each plane includes a set of physical blocks. Each block includes a set of pages. Each page includes a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device can be arranged in a two-dimensional or a three-dimensional grid. Memory cells are formed onto a silicon wafer in an array. A wordline can have a row of associated memory cells in a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane. A block of data can correspond to one or more data addresses in the memory device (e.g., a block, a plurality of blocks, a plurality of cells, etc.). The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits. Depending on the storage architecture employed, data can be stored across the memory planes (i.e., in stripes). Accordingly, one request to read a block of data can result in read operations performed on two or more of the memory planes of the memory device.

Some memory devices can be three-dimensional (3D) memory devices (e.g., 3D NAND devices). For example, a 3D memory device can include memory cells that are placed between sets of layers including a pillar (e.g., polysilicon pillar), a tunnel oxide layer, a charge trap (CT) layer, and a dielectric (e.g., oxide) layer. A 3D memory device can have a "top deck" corresponding to a first side and a "bottom deck" corresponding to a second side. Without loss of generality, the first side can be a drain side and the second side can be a source side. For example, a 3D memory device can be a 3D replacement gate memory device having a replacement gate structure using wordline stacking.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_T$ (also referred to as the "threshold voltage") such that the source-drain electric current is low for the control gate voltage ($V_{CG}$) being below the threshold voltage, $V_{CG} < V_T$. The current increases substantially once the control gate voltage has exceeded the threshold voltage, $V_{CG} > V_T$. Because the actual geometry of the electrodes and gates varies from cell to cell, the threshold voltages can be different even for cells implemented on the same die. The cells can, therefore, be characterized by a distribution P of the threshold voltages, $P(Q, V_T) = dW/dV_T$, where dW represents the probability that any given cell has its threshold voltage within the interval $[V_T, V_T + dV_T]$ when charge Q is placed on the cell.

A memory device can exhibit threshold voltage distributions $P(Q, V_T)$ that are narrow compared with the working range of control voltages tolerated by the cells of the device. Accordingly, multiple non-overlapping distributions $P(Q_k, V_T)$ can be fit into the working range allowing for storage and reliable detection of multiple values of the charge $Q_k$, k=1, 2, 3 . . . . The distributions are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

A valley margin can also be referred to as a read window. For example, in a SLC cell, there is 1 read window that exists with respect to the 2 $V_T$ distributions. As another example, in an MLC cell, there are 3 read windows that exist with respect to the 4 $V_T$ distributions. As yet another example, in a TLC cell, there are 7 read windows that exist with respect to the 8 $V_T$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the cumulative value of the read windows.

As data is repeatedly written and erased in a memory device, such as a flash memory device, the memory device may be more susceptible to errors due to various types of noise and disturb mechanisms inherent within the memory cell, which may be exacerbated with repeated programming. As a result, bit error metrics such as bit error counts and bit error rates (e.g., raw bit error rates (RBERs)) for the memory device can increase over time. Given this pattern, the end-of-life bit error metrics for these devices are much higher as compared to the beginning-of-life bit error metrics for the respective devices.

To alleviate read errors, a memory sub-system may use an error correction technique to correct errors and verify that the data written into the memory device is the same as the data being read from the respective memory device. In some embodiments, the error correction technique can include a low-density parity check (LDPC). For example, an encoder (e.g., LDPC encoder) can be used to encode data being written to a memory device to generate a codeword. A codeword can include a particular number of bits which may correspond to a data transfer size. A codeword can include additional digits as a result of encoding, such as parity digits. For example, a codeword can include raw data ("hard data") initially determined by a hard read. A decoder (e.g., LDPC decoder) can receive the codeword attempt to decode the codeword. Along with the hard data, a decoder can receive soft data that corresponds to the hard data of the codeword (e.g., indicates confidence information about the hard data). The soft data can be determined from soft read(s) of a memory cell (following a hard read of the memory cell) to determine a bit of the codeword. The encoding and decoding processes performed by the respective encoder and decoder can be such that errors in the codeword can be detected and/or corrected by during the decoding process. Illustratively, the encoder can receive, from a host device, k digits of data and generate a codeword including n digits of data (i.e., an n-digit codeword). For example, a digit of data can be a binary digit (i.e., bit). The n-digit codeword can uniquely correspond to the k digits of data, and the n-digit codeword can be stored in the memory sub-system in place of the k digits of data.

One phenomenon observed in memory devices is slow charge loss (SCL). Charge loss due to SCL can occur as a function of elapsed time since programming and/or temperature. Charge loss can cause $V_T$ distribution shift, in which $V_T$ distributions shift towards lower voltage levels. That is, the $V_T$ distribution shift can be proportional to the elapsed time from a programming operation to a read operation and/or temperature. Charge loss and the corresponding $V_T$ distribution shift can, over time, lead to increasing bit error metric values, such as bit error counts and/or bit error rates (e.g., RBERs). For example, trigger rate refers to a rate of read retry errors due to the failure to decode during an initial read. The trigger rate (TR) can illustratively be calculated as $$TR = \frac{N}{T},$$

where N is the number of read errors and T is the total number of reads. As used herein, trigger rate margin (TRM) refers to a threshold amount of trigger rate to meet system performance specification (e.g., a buffer of fail bits where the system can still perform acceptably). For example, if the system can tolerate an error of 100 fail bits, then the read level setting can be set at the level where the number of fail bits is 50 or fewer bits, which corresponds to a buffer of 50 bits (2× buffer or about 6 dB).

Depending on the system workload, it is possible to have variations in the elapsed time since programming across blocks of the memory device. These variations in the elapsed time since programming can result in varying, non-uniform $V_T$ distribution shifts of respective blocks if the programming of blocks is spaced significantly in time. As a result of these non-uniform $V_T$ distribution shifts, it can be difficult to determine or predict an optimal read level offset that can be applied to the majority of the blocks to address charge loss without compromising performance.

Various management techniques exist that can be used by a controller to track charge loss and $V_T$ distribution shift (e.g., center read level changes) for programmed blocks to improve system efficiency and performance. The controller may periodically perform a calibration process ("calibration scan") in order to evaluate a data state metric (e.g., a bit error rate) and associate a block with a predefined time-after-programming (TAP) bins ("bins"). Each bin, in turn, can be associated with at least one read voltage offset to be applied for read operations. Each read voltage offset of a bin can be designated for a respective logical level. Each bin can have a bin index. The associations of block families with bins may be stored in respective metadata tables maintained by the memory sub-system controller.

However, over time, different sets of memory cells, such as pages of a block, may experience various numbers of program-erase cycles, read operations, and media management operations. Such activities can result in disturb (e.g., read disturb). As a result, the bin block assignment may no longer be accurate for reading data from all pages of the blocks associated within the bin, thus increasing the bit error rate and possibly resulting in read errors. "Read error" refers to a failure to decode one or more codewords that have been retrieved from a memory device in response to receiving a read command. Read errors may be associated with host-initiated read operations or system-initiated scanning operations and may occur due to, for example, the measured $V_T$ exhibited by the cell mismatching the applied read voltage level due to temporal voltage shift, the requested data being subjected to noise or interference, etc. In a read error, the number of bit errors in the read data is greater than what the underlying ECC may correct, and this can result in an ECC failure.

A scan operation can be periodically performed with respect to each block of the memory device to determine whether the read level offset for the block, and thus the bin assignment, should be updated to better track charge loss and the corresponding $V_T$ distribution shift over time. For example, if the scan operation indicates that the read level offset should be updated to the read level offset assigned to another bin (e.g., bin 2), then the block can be reassigned to the other bin. The periodicity of the scan operation with respect to a block can be a function of the length of time it takes to scan each block, and the total number of blocks of the memory device.

Cells of a block of a memory device can operate in a transient state. For example, for a 3D memory device, the transient state is a state during which a channel polarization bias of the block moves toward a negative voltage relative to a ground voltage (e.g., 0 V) reference. The negative voltage can result from the capacitive coupling that is generated after repeated read operations. After enough time passes from the last read operation to be performed with respect to the block (e.g., about 10 seconds (s) to about 100 s), the block of the memory device can enter a stable state. The stable state is a state during which the channel polarization bias of the block moves toward the ground voltage (e.g., 0V).

The optimal threshold voltage offset assignment for the block while in the transient state can be different than the optimal bin assignment for the block while in a non-transient state (e.g., stable state or a transition state between the stable state and the transient state). This can be due to differences in read metrics (e.g., RWB and $V_T$) between the transient state and the stable state, which is caused by the different electrical properties observable in the stable and transient states. The stable state can be a short-lived state, and the block can be in the transient state for the majority of the time that the memory device is operating. For example, the block can transition from the stable state to the transient state in an amount of time on the order of 10 milliseconds (ms). Accordingly, since blocks of the memory device will most likely be in the transient state during memory device operation, the read level offsets assigned to respective bins used for reading the blocks can be optimized for the transient state.

If the memory device is powered off for a long time, the resulting charge loss can cause bin misalignment with respect to a block due to the change in read level offset that may be needed to read a block. Since the memory device may not know how long the memory device has been powered off, a controller (e.g., local media controller) can initiate a scan operation after the memory device is powered on to determine a bin assignment block for the block. Moreover, if the memory device is powered off for a long time, a block of the memory device can initially be in the stable state at the moment when the memory device is powered on. However, as discussed above, the bin assignments may be optimized for the transient state. For example, the stable state can cause a bin shift "to the right" (e.g., if Bin X is selected as the optimal bin during the stable state, then Bin X−1 may be the true optimal bin). Thus, performing the scan operation before fully entering the transient state can lead to sub-optimal block bin assignments, which in turn can lead to increases in read errors.

To address the potential of sub-optimal bin assignments after powering on the memory device, in some implementations, the controller can implement a scan delay. The scan delay can be defined as a delay between the time that the memory device is powered on and the time that the scan operation is initiated. The scan delay can be chosen to be long enough to ensure that the block transitions from the stable state to the transient state, or to some transition state that is sufficiently close to the transient state.

Alternatively, a block can transition from the transient state to the stable state. The transition from the transient state to the stable state can cause $V_T$ shift and thus a greater number of bit errors (e.g., higher RBER). The speed of transition (i.e., the transition time) from the transient state to the stable state can affect the number of bit errors. More specifically, shorter transition times from the transient state to the stable state can lead to a greater number of read errors.

The transition time from the transient state to the stable state can be affected by the operating temperature of the memory device. More specifically, the transition time from the transient state to the stable state can decrease at higher temperatures and increase at lower temperatures. This phenomenon is at least partially caused by the effect of higher temperatures on leakage through string drivers within blocks. For example, after a read operation, a wordline floating voltage can be applied to a local wordline to maintain a cell in a transient state. A local wordline is a wordline that is within a particular block of the memory device (i.e., an intra-block wordline). During power-on standby, a global wordline and a string driver coupled to a block of the memory device can be biased to ground (e.g., 0 V). A global wordline is a wordline that is shared among a group of blocks of a memory device (i.e., an inter-block wordline). The wordline floating voltage during standby will cause subthreshold leakage or any off leakage that will gradually discharge the wordline floating voltage. Once the wordline floating voltage is fully discharged to ground, the cell is transitioned into the stable state. The rate of the leakage increases as a function of temperature, such that higher temperatures lead to decreased transition times.

To increase the transition time and reduce read errors, a controller can apply a positive bias voltage to the global wordline in order to increase the transition time of the block from the transient state to the stable state (e.g., after powering off the memory device). For example, the positive voltage can be a power supply voltage (e.g., Vcc). However, the positive bias voltage applied to the global wordline can cause erase state (e.g., L0) charge gain. For example, the erase state charge gain can be caused by shallow hole traps generated during program/erase cycles. For cells that have undergone a high number of program/erase cycles, holes in low programming state levels (e.g., L0) tend to detrap, which can cause $V_T$ shift (e.g., increased $V_T$). Therefore, it may be not beneficial to continuously apply the positive bias voltage to the global wordline, particularly when the memory device is at a lower temperature during which the speed of transition from the transient state to the stable state decreases.

Aspects of the present disclosure address the above and other deficiencies by implementing global wordline bias voltages for read state transitions. More specifically, a controller can select a magnitude of a bias voltage to be applied to a global wordline to increase the transition time of a block of a memory device from the transient state to the stable state (e.g., after powering off the memory device). The controller can then cause the bias voltage to be applied to the global wordline.

A controller can select a magnitude of a bias voltage to be applied to the global wordline in accordance with a set of parameters related to a memory device, and apply the bias voltage to the global wordline. For example, the set of parameters can include a temperature of the memory device (e.g., operating temperature of the memory device).

In some embodiments, selecting the magnitude of the bias voltage to be applied to the global wordline in accordance with the temperature of the memory device includes utilizing a discrete bias voltage selection method. For example, utilizing the discrete bias voltage selection method can include determining whether the temperature of the memory device satisfies a threshold condition. For example, determining whether the temperature of the memory device satisfies the threshold condition can include determining whether the temperature of the memory device is greater than or equal to a threshold temperature. The threshold temperature can be experimentally determined for the memory device and system latency requirement. For example, the threshold temperature can be a temperature at which the memory device normally operations (i.e., normal operating temperature).

If the temperature of the memory device satisfies the threshold condition (e.g., the temperature of the memory device is greater than or equal to the threshold temperature), this means that the memory device is at a high temperature that can cause a faster transition from the transient state to the stable state, which can lead to an increased number of potential bit errors. Thus, the controller can select a positive bias voltage to be applied to the global wordline to decrease the speed of the transition and thus decrease the number of potential bit errors. In some embodiments, the positive voltage is a power supply voltage (e.g., Vcc). In some embodiments, the positive voltage is the difference between the power supply voltage and $V_T$ (e.g., Vcc–$V_T$).

If the temperature of the memory device does not satisfy the threshold condition (e.g., the temperature of the memory device is less than the threshold temperature), this means that the memory device is at a sufficiently cold temperature to that can cause a sufficiently slow transition from the transient state to the stable state, which can lead to fewer potential bit errors. Since it is not necessary to apply a positive bias voltage to decrease the transition speed, the controller can select a ground bias voltage (0 V) to be applied to the global wordline to prevent erase state (e.g., L0) charge gain.

Since leakage current through string drivers can increase with operating temperature, global WL standby bias will need to increase with operation temperature to control the leakage current variation at different temperatures. In some embodiments, selecting the magnitude of the bias voltage to be applied to the global wordline in accordance with the temperature of the memory device includes utilizing a continuous bias voltage selection method. More specifically, utilizing the continuous bias voltage selection method can include determining the magnitude of the bias voltage to be applied to the global wordline as a function of the temperature of the memory device. The magnitude of the bias voltage to be applied to the global wordline can be proportional to the temperature of the memory device. For example, the function can be a linear function. Illustratively, the function can be defined as f(T)=aT+b, where T is the temperature of the memory device (° C.), a>0 is a temperature compensation value, and b is the magnitude of a base bias voltage applied to the global wordline when T=0 (i.e., about 0° C.). The values of the temperature compensation value and the magnitude of the base bias voltage can be determined experimentally, based on string drive leakage characteristics. For example, the values of the temperature compensation value and the magnitude of the base bias voltage can be selected to maintain low leakage at high temperatures and low temperatures.

The discrete bias voltage selection method and the continuous bias voltage selection method can each achieve bit error metric improvement during sufficiently high temperatures and reduce erase state charge gain during sufficiently low temperatures. The discrete bias voltage selection method can be easier to implement than the continuous bias voltage method. Although the continuous bias voltage selection method is more complex to implement, it can achieve better results as compared to the discrete bias voltage selection method (e.g., more optimized transient state to stable state transitions and erase state charge gain control).

As another example, the set of parameters can include a standby time. A standby time is an amount of time from when the memory device (e.g., a block of the memory device) has been accessed. A longer standby time increases the likelihood that a block is in the stable state. Thus, a direct relationship can exist between the standby time and the magnitude of the bias voltage. It can be observed (e.g., from probing data) that local wordline voltage can decrease with standby time. Local wordline voltage can be increased to avoid the stable state, such as by raising the bias voltage to be applied to the global wordline. For example, after the standby time exceeds a threshold standby time, the bias voltage to be applied to the global wordline can be raised to a maximum voltage (e.g., about 4 V). Further details regarding implementing global wordline bias voltages during read state transitions will be described below with reference to FIGS. 1A-7.

Advantages of the present disclosure include, but are not limited to, improved memory device performance and reliability. For example, embodiments described herein can achieve improved read performance and erase state charge gain during transitions from the transient state to the stable state.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory device 130 can further include a global wordline bias voltage (GWBV) component 137. The GWBV component 137 can be implemented by the memory sub-system controller 115 and/or the local media controller 135. In this example, the GWBV component 137 is shown as being a component of the local media controller 135. In other examples, the GWBV component 137 can be a component of the memory sub-system controller 115.

The GWBV component 137 can identify a set of parameters related to the memory device. For example, the set of parameters can include a temperature of the memory device 130. For example, the temperature can be an operating temperature of the memory device. The GWBV component 137 can select a magnitude of a bias voltage to be applied to a global wordline. More specifically, the magnitude of the bias voltage can be selected to modify the speed of transition between the transient state to the stable state.

The GWBV component 137 can select a magnitude of the bias voltage using the set of parameters, and cause the bias voltage to be applied to the global wordline. In some embodiments, selecting the magnitude of the bias voltage includes utilizing a continuous bias voltage selection method. More specifically, utilizing the continuous bias voltage selection method can include determining the magnitude of the bias voltage to be applied to the global wordline as a function of the temperature. The magnitude of the bias voltage to be applied to the global wordline can be proportional to the temperature. For example, the function can be a linear function. Illustratively, the function can be defined as $f(T)=aT+b$, where T is the temperature of the memory device (° C.), a>0 is a temperature compensation value, and b is the magnitude of a base bias voltage applied to the global wordline when T=0 (i.e., about 0° C.). Further details regarding these embodiments will be described below with reference to FIG. 6A.

In some embodiments, selecting the magnitude of the bias voltage includes utilizing a discrete bias voltage selection method. More specifically, utilizing the discrete bias voltage selection method can include determining whether the temperature satisfies a threshold condition. For example, determining whether the temperature of the memory device satisfies the threshold condition can include determining whether the temperature of the memory device is greater than or equal to a threshold temperature. In response to determining that the temperature satisfies the threshold condition (e.g., the temperature is greater than or equal to the threshold temperature), this means that the memory device 130 is at a high temperature that can cause a faster transition from the transient state to the stable state, which can lead to an increased number of potential bit errors. Thus, the GWBV component 130 can select a positive bias voltage to be applied to the global wordline to decrease the speed of the transition and decrease the number of potential bit errors. In some embodiments, the positive voltage is a power supply voltage (e.g., Vcc). In some embodiments, the positive voltage is the difference between the power supply voltage and $V_T$ (e.g., Vcc–$V_T$). In response to determining that the temperature does not satisfy the threshold condition (e.g., the temperature is less than the threshold temperature), this means that the memory device 130 is at a sufficiently cold temperature to that can cause a sufficiently slow transition from the transient state to the stable state, which can lead to fewer potential bit errors. Since it is not necessary to apply a positive bias voltage to decrease the transition speed, the GWBV component 137 can select a ground bias voltage (0 V) to be applied to the global wordline to prevent erase state (e.g., L0) charge gain.

As another example, the set of parameters can further include a standby time. The standby time is an amount of time from when the memory device 130 (e.g., a block of the memory device 130) has been accessed. A longer standby time increases the likelihood that a block is in the stable state. Thus, a direct relationship can exist between the standby time and the magnitude of the bias voltage. It can be observed (e.g., from probing data) that local wordline voltage can decrease with standby time. Local wordline voltage can be increased to avoid the stable state, such as by raising the bias voltage to be applied to the global wordline. For example, after the standby time exceeds a threshold standby time, the bias voltage to be applied to the global wordline can be raised to a maximum voltage (e.g., about 4 V). Further details regarding the operations of the GWBV component 137 will now be described below with reference to FIGS. 1B-6B.

Figure 1B:
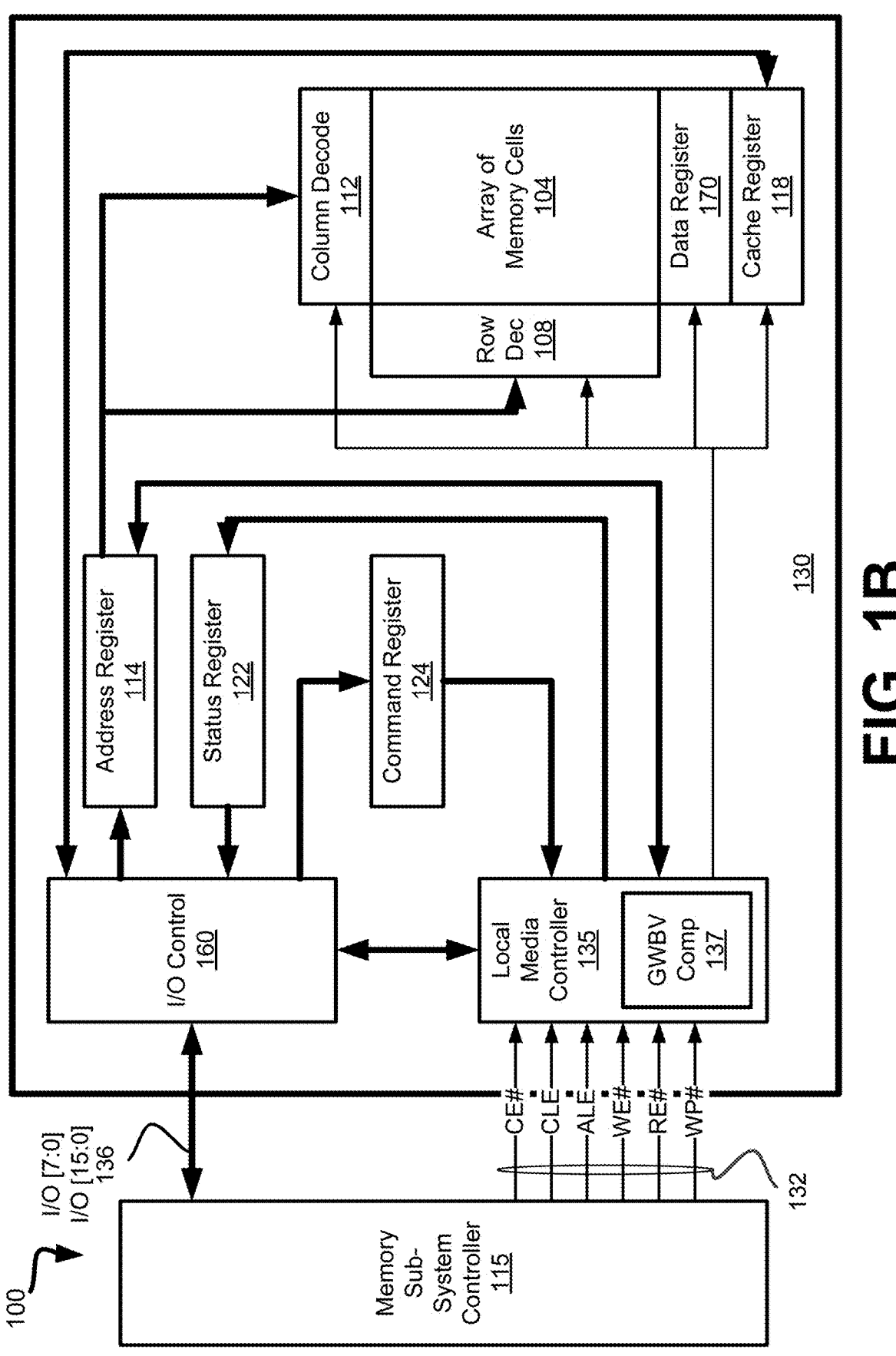
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are connected to the same access line (e.g., a wordline) while memory cells of a logical column are selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 112 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 112 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 112 to control the row decode circuitry 108 and column decode circuitry 112 in response to the addresses. In one embodiment, local media controller 135 includes the BV component 137, which can implement the defect detection described herein during an erase operation on memory device 130.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 170 for transfer to the array of memory cells 104; then new data may be latched in the cache register 118 from the I/O control circuitry 160. During a read operation, data may be passed from the cache register 118 to the I/O control circuitry 160 for output to the memory sub-system controller 115; then new data may be passed from the data register 170 to the cache register 118. The cache register 118 and/or the data register 170 may form (e.g., may form a portion of) a page buffer of the memory device 130. A page buffer may further include sensing devices (not shown in FIG. 1B) to sense a data state of a memory cell of the array of memory cells 204, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 160 and may then be written into command register 124. The addresses may be received over input/output (I/O) pins [7:0] of I/O bus 136 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 118. The data may be subsequently written into data register 170 for programming the array of memory cells 104.

In an embodiment, cache register 118 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 2A:
FIGS. 2A-2C are diagrams of portions of an example array of memory cells included in a memory device, in accordance with some embodiments of the present disclosure.
Figure 2B:
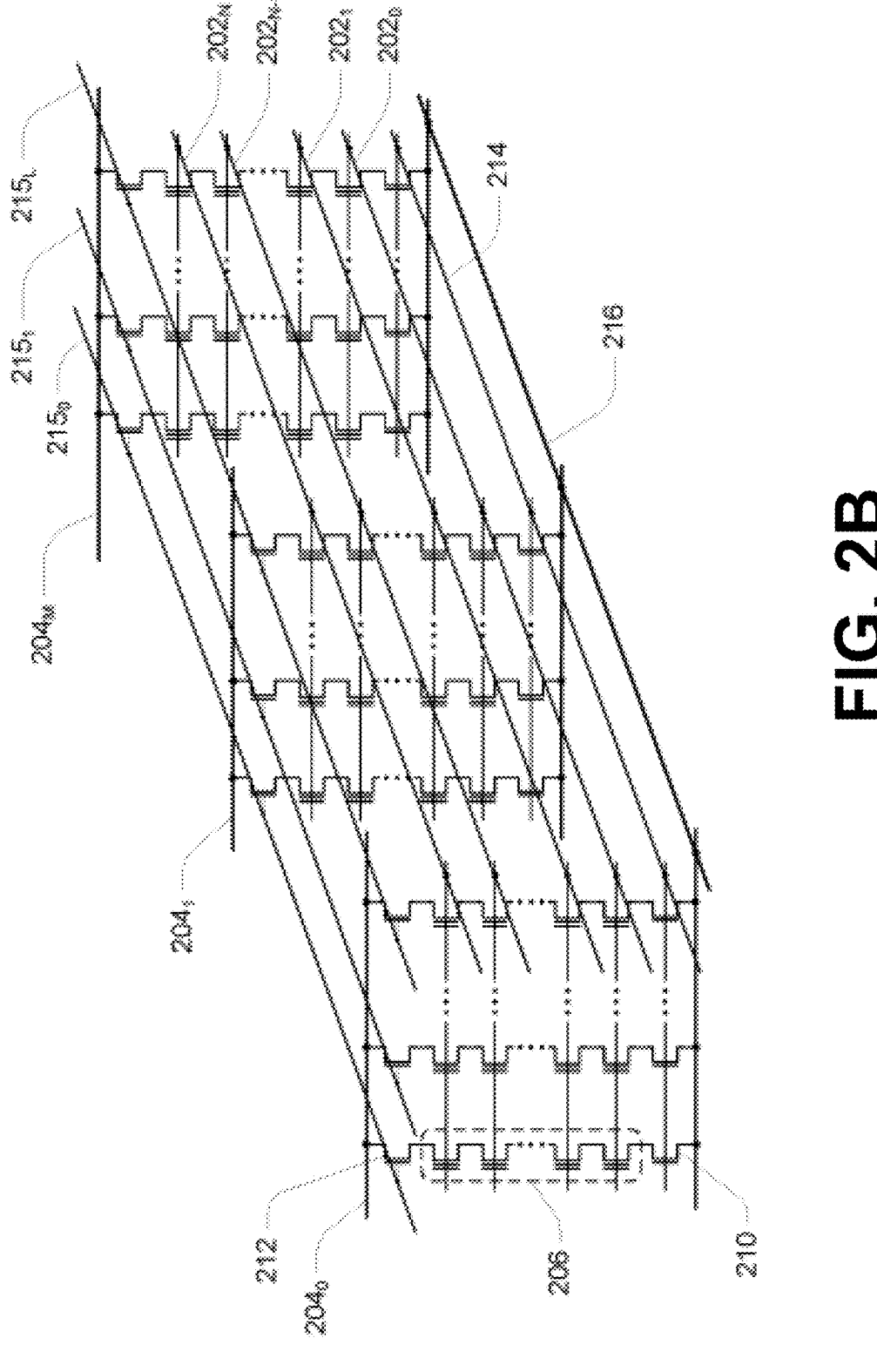
Figure 2C:
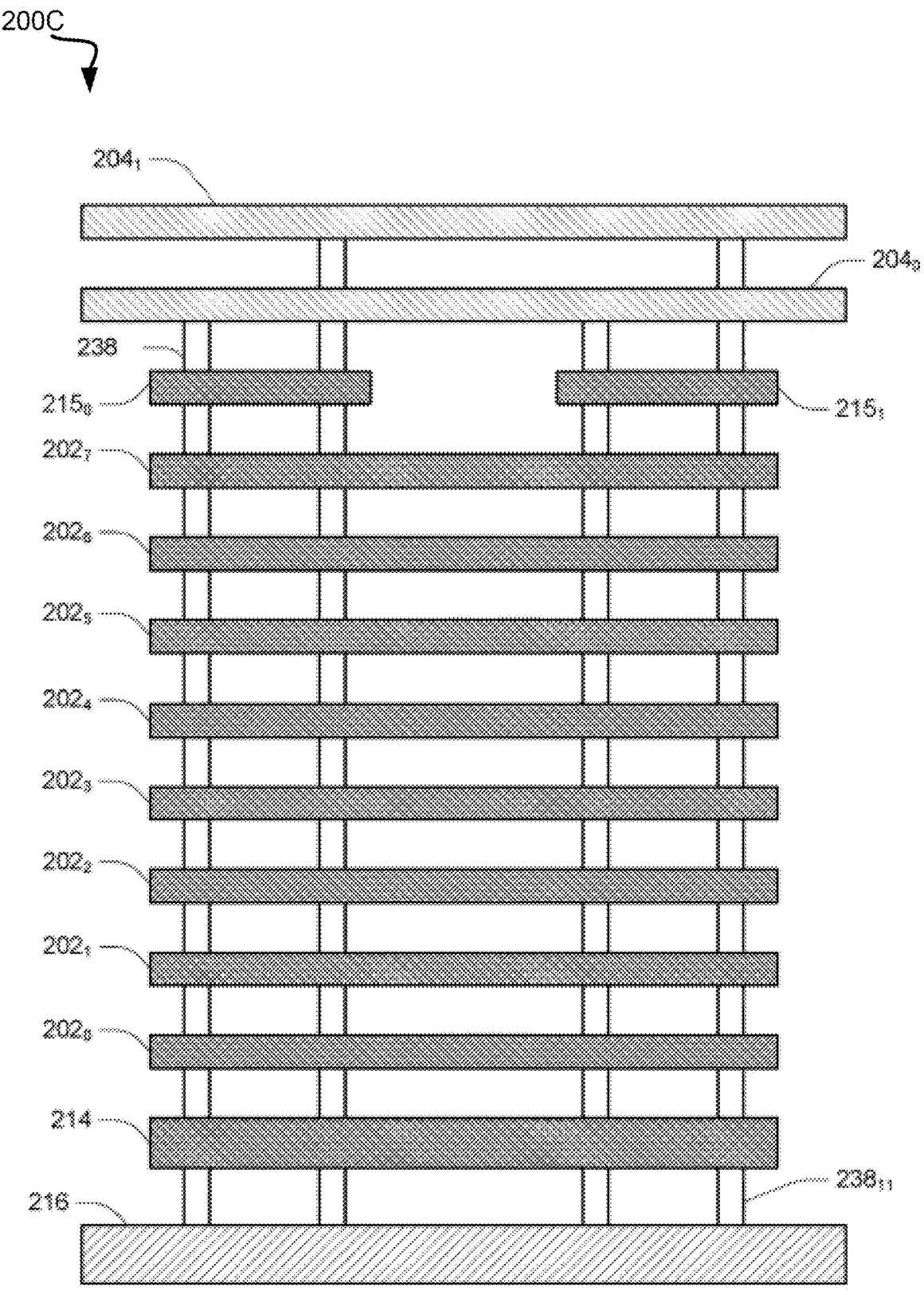

FIGS. 2A-2C are diagrams of portions of an example array of memory cells included in a memory device, in accordance with some embodiments of the present disclosure. For example, FIG. 2A is a schematic of a portion of an array of memory cells 200A as could be used in a memory device (e.g., as a portion of array of memory cells 104). Memory array 200A includes access lines, such as wordlines $202_0$ to $202_N$, and a data line, such as bitline 204. The wordlines 202 may be connected to global access lines (e.g., global wordlines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A can be arranged in rows each corresponding to a respective wordline 202 and columns each corresponding to a respective bitline 204. Rows of memory cells 208 can be divided into one or more groups of physical pages of memory cells 208, and physical pages of memory cells 208 can include every other memory cell 208 commonly addressable by a given wordline 202. For example, memory cells 208 commonly addressable by wordline $202_N$ and selectively connected to even bitlines 204 (e.g., bitlines $204_0$, $204_2$, $204_4$, etc.) may be one physical page of memory cells 208 (e.g., even memory cells) while memory cells 208 commonly addressable by wordline $202_N$ and selectively connected to odd bitlines 204 (e.g., bitlines $204_1$, $204_3$, $204_5$, etc.) may be another physical page of memory cells 208

(e.g., odd memory cells). Although bitlines $204_3$-$204_5$ are not explicitly depicted in FIG. 2A, it is apparent from the figure that the bitlines 204 of the array of memory cells 200A may be numbered consecutively from bitline $204_0$ to bitline $204_M$. Other groupings of memory cells 208 commonly addressable by a given wordline 202 may also define a physical page of memory cells 208. For certain memory devices, all memory cells commonly addressable by a given wordline might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells addressable by wordlines $202_0$-$202_N$ (e.g., all strings 206 sharing common wordlines 202). Unless expressly distinguished, a reference to a page of memory cells herein refers to the memory cells of a logical page of memory cells.

Each column can include a string of series-connected memory cells (e.g., non-volatile memory cells), such as one of strings $206_0$ to $206_M$. Each string 206 can be connected (e.g., selectively connected) to a source line 216 (SRC) and can include memory cells $208_0$ to $208_N$. The memory cells 208 of each string 206 can be connected in series between a select gate 210, such as one of the select gates $210_0$ to $210_M$, and a select gate 212, such as one of the select gates $212_0$ to $212_M$. In some embodiments, the select gates $210_0$ to $210_M$ are source-side select gates (SGS) and the select gates $212_0$ to $212_N$ are drain-side select gates. Select gates $210_0$ to $210_M$ can be connected to a select line 214 (e.g., source-side select line) and select gates $212_0$ to $212_M$ can be connected to a select line 215 (e.g., drain-side select line). The select gates 210 and 212 might represent a plurality of select gates connected in series, with each select gate in series configured to receive a same or independent control signal. A source of each select gate 210 can be connected to SRC 216, and a drain of each select gate 210 can be connected to a memory cell $208_0$ of the corresponding string 206. Therefore, each select gate 210 can be configured to selectively connect a corresponding string 206 to SRC 216. A control gate of each select gate 210 can be connected to select line 214. The drain of each select gate 212 can be connected to the bitline 204 for the corresponding string 206. The source of each select gate 212 can be connected to a memory cell $208_N$ of the corresponding string 206. Therefore, each select gate 212 might be configured to selectively connect a corresponding string 206 to the bitline 204. A control gate of each select gate 212 can be connected to select line 215.

In some embodiments, and as will be described in further detail below with reference to FIG. 2B, the memory array in FIG. 2A is a three-dimensional memory array, in which the strings 206 extend substantially perpendicular to a plane containing SRC 216 and to a plane containing a plurality of bitlines 204 that can be substantially parallel to the plane containing SRC 216.

FIG. 2B is another schematic of a portion of an array of memory cells 200B (e.g., a portion of the array of memory cells 104) arranged in a three-dimensional memory array structure. The three-dimensional memory array 200B may incorporate vertical structures which may include semiconductor pillars where a portion of a pillar may act as a channel region of the memory cells of strings 206. The strings 206 may be each selectively connected to a bit line $204_0$-$204_M$ by a select gate 212 and to the SRC 216 by a select gate 210. Multiple strings 206 can be selectively connected to the same bitline 204. Groups of strings 206 can be connected to their respective bitlines 204 by biasing the select lines 2150-215L to selectively activate particular select gates 212 each between a string 206 and a bitline 204. The select gates 210 can be activated by biasing the select line 214. Each wordline 202 may be connected to multiple rows of memory cells of the memory array 200B. Rows of memory cells that are commonly addressable by each other by a particular wordline 202 may collectively be referred to as tiers.

FIG. 2C is a diagram of a portion of an array of memory cells 200C (e.g., a portion of the array of memory cells 104). Channel regions (e.g., semiconductor pillars) 238 represent the channel regions of different strings of series-connected memory cells (e.g., strings 206 of FIGS. 2A-2B) selectively connected to the bitline $204_0$ and/or bitline $204_1$. A memory cell (not depicted in FIG. 2C) may be formed at each intersection of a wordline 202 and a channel region 238, and the memory cells corresponding to a single channel region 238 may collectively form a string of series-connected memory cells (e.g., a string 206 of FIGS. 2A-2B). Additional features might be common in such structures, such as dummy wordlines, segmented channel regions with interposed conductive regions, etc.

Figure 3:
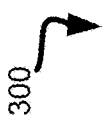
FIG. 3-4 are diagrams of memory devices including a global wordline and a local wordline, in accordance with some embodiments of the present disclosure.

FIG. 3 is a diagram of an example memory device 300, in accordance with some embodiments of the present disclosure. As shown, the memory device 300 includes a plurality of blocks 310-1 through 310-N. Each block 310-1 through 310-N includes a respective global wordline driver (GWLD) of a plurality of GWLDS 320-1 through 320-N. Each block of the plurality of blocks 310-1 through 310-N can include a respective set of local select gate lines (e.g., SGD and SGS), a respective set of local wordlines, a respective select signal line (BSEL), and a respective decoder. For example, Block 310-1 includes SGD 330-1, WL1 331-1 through WLM 334-1, BSEL 335-1, SGS 336-1, and decoder 340-1. As another example, Block 310-2 includes SGD 330-2, WL1 331-2 through WLM 334-2, BSEL 335-2, SGS 336-2, and decoder 340-2.

The memory device 300 can further include a plurality of global lines connected across the plurality of blocks 310-1 through 310-N, where each global line is connected to a respective line of the plurality of blocks 310-1 through 310-N. More specifically, the plurality of global lines can include a global SGD line 360, a global SGS line 370 and a set of global wordlines (GWL) 380. Each of the local SGD lines is connected to the global SGD line 360, each of the local SGS lines is connected to a global SGS line 370, and each of the local wordlines is connected to a corresponding global wordline of GWL 380. For example, a first global wordline of GWL 380 can be connected to each WL1 (e.g., WL1 331-1 and WL1 331-2), a second global wordline of GWL 380 can be connected to each WL2 (e.g., WL2 332-1 and WL2 332-2), etc. Further details regarding global wordlines and local wordlines will now be described below with reference to FIG. 4.

Figure 4:
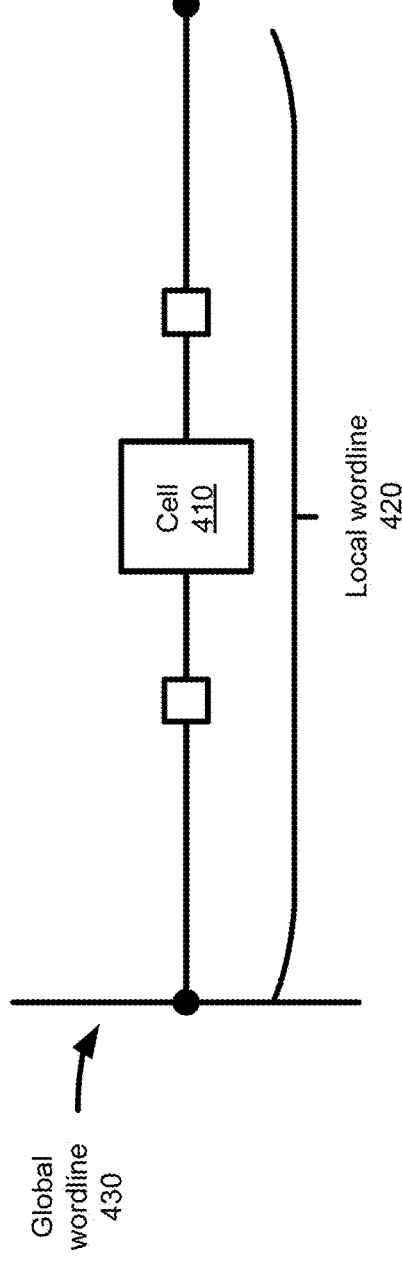
Figure 4:

FIG. 4 is a diagram of an example memory device 400, in accordance with some embodiments of the present disclosure. As shown, the system 400 includes a cell 410 of a block addressable by a local wordline 420 and a global wordline 430. For example, if the cell 410 includes a field-effect transistor (FET), the local wordline 420 can be connected to the gate of the cell 410.

As described above with reference to FIG. 1A and as will be described in further detail below with reference to FIGS. 5-6B, a controller (e.g., the local media controller 135 of FIG. 1A) can select a magnitude of a bias voltage to be applied to the global wordline 430 in accordance with a set of parameters, and can cause the bias voltage to be applied to the global wordline.

In some embodiments, the set of parameters includes a temperature of the memory device 400. For example, the controller can select a positive bias voltage for sufficiently high temperatures, and apply the positive bias voltage to the global wordline 430 to increase the transition time of the block (and thus the cell 410) from the transient state to the stable state.

In some embodiments, selecting the magnitude of the bias voltage to be applied to the global wordline 430 in accordance with the temperature of the memory device 400 includes utilizing a discrete bias voltage selection method. More specifically, utilizing the discrete bias voltage selection method can include determining whether the temperature of the memory device 400 satisfies a threshold condition. For example, determining whether the temperature of the memory device 400 satisfies the threshold condition can include determining whether the temperature of the memory device is greater than or equal to a threshold temperature.

In response to determining that the temperature of the memory device 400 satisfies the threshold condition (e.g., the temperature of the memory device 400 is greater than or equal to the threshold temperature), this means that the memory device 400 is at a high temperature that can cause a faster transition from the transient state to the stable state, which can lead to an increased number of potential bit errors. Thus, the controller can select a positive bias voltage to be applied to the global wordline 430 to increase the transition time and decrease the number of potential bit errors. In some embodiments, the positive voltage is a power supply voltage (e.g., Vcc). In some embodiments, the positive voltage is the difference between the power supply voltage and $V_T$ (e.g., $Vcc-V_T$).

In response to determining that the temperature of the memory device 400 does not satisfy the threshold condition (e.g., the temperature of the memory device 400 is less than the threshold temperature), this means that the memory device 400 is at a sufficiently cold temperature to that can cause a sufficiently slow transition from the transient state to the stable state, which can lead to fewer potential bit errors. Since it is not necessary to apply a positive bias voltage to increase transition time, the controller can select a ground bias voltage (0 V) to be applied to the global wordline to prevent erase state (e.g., L0) charge gain.

In some embodiments, selecting the magnitude of the bias voltage to be applied to the global wordline 430 in accordance with the temperature of the memory device includes utilizing a continuous bias voltage selection method. More specifically, utilizing the continuous bias voltage selection method can include determining the magnitude of the bias voltage to be applied to the global wordline 430 as a function of the temperature of the memory device 400. The magnitude of the bias voltage to be applied to the global wordline 430 can be proportional to the temperature of the memory device 400. For example, the function can be a linear function. Illustratively, the function can be defined as f(T) $=aT+b$, where is the temperature of the memory device 400 (° C.), a>0 is a temperature compensation value, and b is the magnitude of the voltage bias applied to the global wordline 430 when T=0 (i.e., about 0° C.).

In some embodiments, the set of parameters includes a standby time determined for the memory device 400. A longer standby time increases the likelihood that a block is in the stable state. Thus, a direct relationship can exist between the standby time and the magnitude of the bias voltage. It can be observed (e.g., from probing data) that local wordline voltage can decrease with standby time. Local wordline voltage can be increased to avoid the stable state, such as by raising the bias voltage to be applied to the global wordline. For example, after the standby time exceeds a threshold standby time, the bias voltage to be applied to the global wordline can be raised to a maximum voltage (e.g., about 4 V). Further details regarding implementing global wordline bias voltages for read state transitions will now be described below with reference to FIG. 5.

Figures 5, 6A:
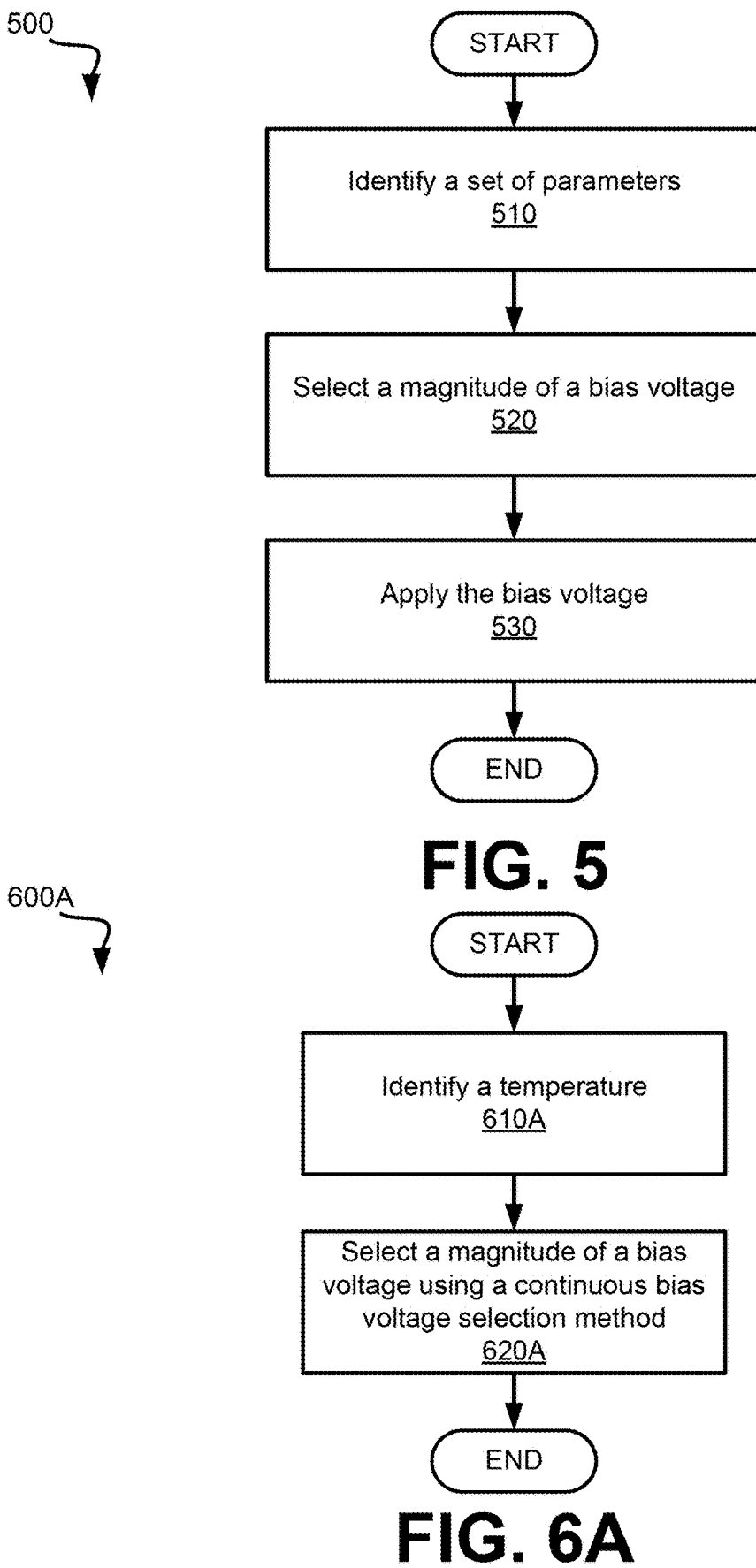
FIG. 5 is a flow diagram of an example method to implement global wordline bias voltages for read state transitions, in accordance with some embodiments of the present disclosure.
FIGS. 6A-6B are flow diagrams of example methods to select a magnitude of a global wordline bias voltage, in accordance with some embodiments of the present disclosure.

FIG. 5 is a flow diagram of an example method 500 to implement global wordline bias voltages for read state transitions, in accordance with some embodiments of the present disclosure. The method 500 can be performed by control logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the GWBV component 137 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, a set of parameters is identified. For example, control logic can identify a set of parameters related to a memory device. The memory device can be the memory device 130 of FIGS. 1A-1B, and the block can be included in a memory array of the memory device (e.g., the memory array 104 of FIG. 1B). For example, the set of parameters can include a temperature of the memory device. More specifically, the temperature can be an operating temperature of the memory device. As another example, the set of parameters can include a standby time. The standby time is an amount of time from when the memory device (e.g., a block of the memory device) has been accessed.

At operation 520, a magnitude of a bias voltage is selected. For example, control logic can determine the magnitude of the bias voltage to be applied to a global wordline connected to the block based on the set of parameters. The bias voltage, when applied to the global wordline, can increase the transition time of the block from a transient state to a stable state. For example, to prevent negative effects due to the application of a positive bias voltage to the global wordline (e.g., erase state charge gain), the magnitude of the bias voltage can be determined based at least in part on the temperature. In some embodiments, and as will be described in further detail below with reference to FIG. 6A, selecting the magnitude of the bias voltage includes utilizing a continuous bias voltage selection method. For example, the magnitude of the bias voltage can be proportional to the temperature. In some embodiments, and as will be described in further detail below with reference to FIG. 6B, selecting the magnitude of the bias voltage includes utilizing a discrete bias voltage selection method. For example, the magnitude of the bias voltage can either be a positive bias voltage (e.g., Vcc or Vcc–$V_T$) if the temperature satisfies a threshold condition, or a ground bias voltage (e.g., 0 V) if the temperature does not satisfy the threshold condition. The discrete bias voltage selection method and the continuous bias voltage selection method can each achieve bit error metric improvement during sufficiently high temperatures and reduce erase state charge gain during sufficiently low temperatures. The discrete bias voltage selection method can be easier to implement than the continuous bias voltage method. Although the continuous bias voltage selection method is more complex to implement, it can achieve better results as compared to the discrete bias voltage selection method (e.g., more optimized transient state to stable state transitions and erase state charge gain control).

In some embodiments, the set of parameters includes a standby time of the memory device. The standby time is an amount of time from when the memory device (e.g., a block of the memory device) has been accessed. A longer standby time increases the likelihood that a block is in the stable state. Thus, a direct relationship can exist between the standby time and the magnitude of the bias voltage. It can be observed (e.g., from probing data) that local wordline voltage can decrease with standby time. Local wordline voltage can be increased to avoid the stable state, such as by raising the bias voltage to be applied to the global wordline. For example, after the standby time exceeds a threshold standby time, the bias voltage to be applied to the global wordline can be raised to a maximum voltage (e.g., about 4 V).

At operation 530, the bias voltage is applied. For example, control logic can cause the bias voltage to be applied to the global wordline. The application of a positive bias voltage to the global wordline can increase the transition time of the block from the transient state to the stable state (e.g., for higher temperature conditions). The application is a ground bias voltage to the global wordline may not affect the transition time of the block from the transient state to the stable state (e.g., for sufficiently colder temperature conditions), but can prevent the negative effects described above (e.g., erase state charge gain). Further details regarding operations 510-530 are described above with reference to FIGS. 1A-4 and will be described in further detail below with reference to FIGS. 6A-6B.

FIG. 6A is a flow diagram of an example method 600A to select a magnitude of a global wordline bias voltage, in accordance with some embodiments of the present disclosure. More specifically, the method 600A is an example of a continuous bias voltage selection method that can be performed implement temperature-dependent global wordline standby bias voltages during read state transitions (e.g., transitions from a transient state to a stable state). The method 600A can be performed by control logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600A is performed by the GWBV component 137 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610A, a temperature is identified. For example, control logic can determine the temperature of a memory device. The memory device can include a block. The memory device can be the memory device 130 of FIGS. 1A-1B, and the block can be a memory array of the memory device (e.g., the memory array 104 of FIG. 1B).

At operation 620A, a magnitude of a bias voltage is selected using a continuous bias voltage selection method. For example, control logic can determine the magnitude of the bias voltage to be applied to a global wordline connected to the block as a function of the temperature. The magnitude of the bias voltage to be applied to the global wordline can be proportional to the temperature of the memory device. For example, the function can be a linear function. Illustratively, the function can be defined as $f(T)=aT+b$, where T is the temperature of the memory device (° C.), a>0 is a temperature compensation value, and b is the magnitude of the voltage bias applied to the global wordline when T=0 (i.e., 0° C.). Further details regarding operations 610A-620A are described above with reference to FIGS. 1A and 3-5.

Figure 6B:
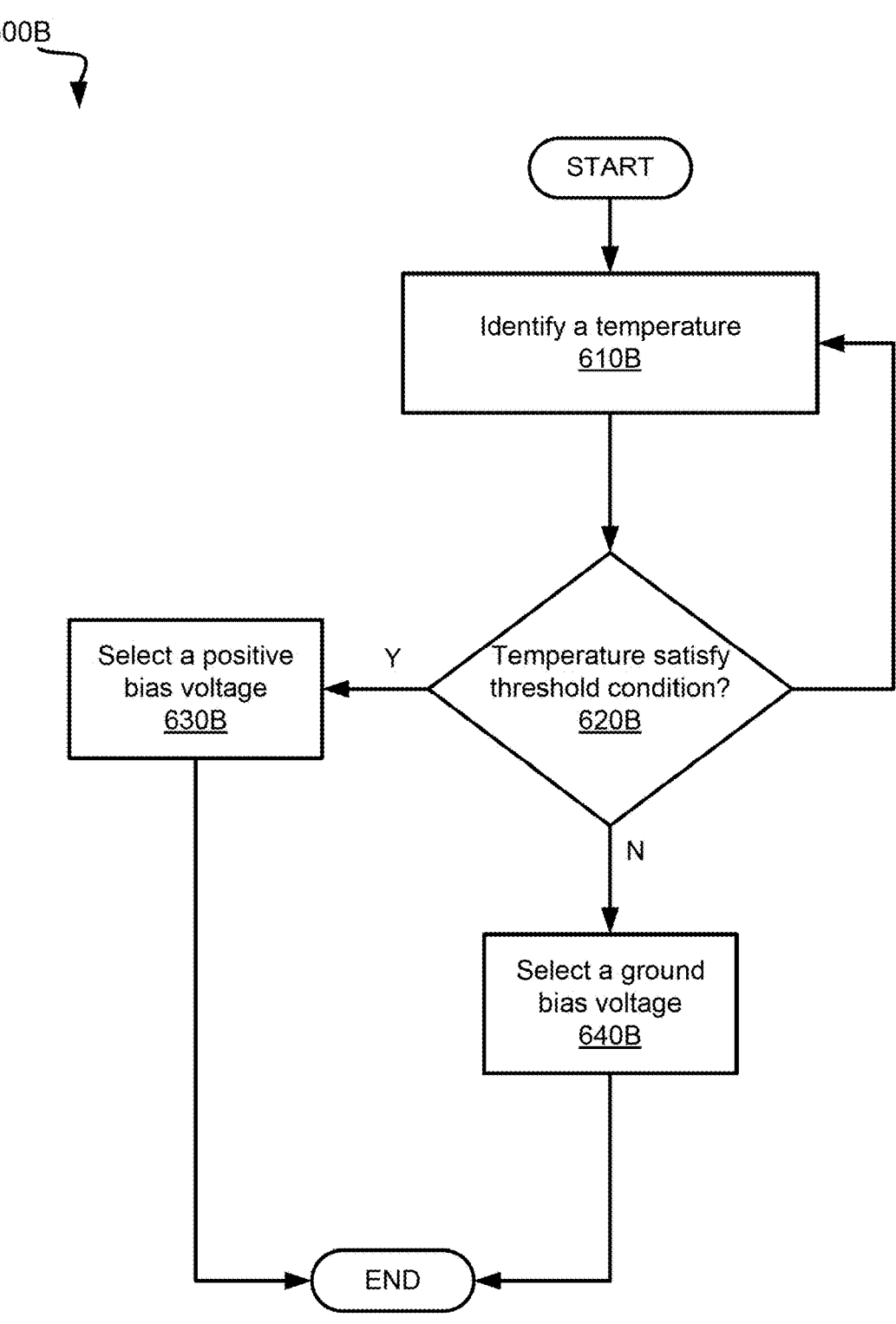

FIG. 6B is a flow diagram of an example method 600B to select a magnitude of a global wordline bias voltage, in accordance with some embodiments of the present disclosure. More specifically, the method 600B is an example of a discrete bias voltage selection method that can be performed implement temperature-dependent global wordline standby bias voltages during read state transitions (e.g., transitions from a transient state to a stable state). The method 600B can be performed by control logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600B is performed by the GWBV component 137 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610B, a temperature is identified. For example, control logic can determine a temperature of a memory device. The memory device can include a block. The memory device can be the memory device 130 of FIGS. 1A-1B, and the block can be a memory array of the memory device (e.g., the memory array 104 of FIG. 1B).

At operation 620B, a determination is made. For example, control logic can determine whether the temperature satisfies a threshold condition. For example, determining whether the temperature of the memory device satisfies the threshold condition can include determining whether the temperature of the memory device is greater than or equal to a threshold temperature. In some embodiments, the threshold temperature is between about 50° C. to about 60° C.

In response to determining that the temperature of the memory device satisfies the threshold condition (e.g., the temperature of the memory device is greater than or equal to the threshold temperature), this means that the memory device is at a high temperature that can cause a faster transition from the transient state to the stable state (i.e., shorter transition time), which can lead to an increased number of potential bit errors. Thus, at operation 630B, a positive bias voltage is selected. For example, control logic can select the positive bias voltage to be applied to the global wordline. In some embodiments, the positive voltage is a power supply voltage (e.g., Vcc). In some embodiments, the positive voltage is the difference between the power supply voltage and $V_T$ (e.g., Vcc–$V_T$). The positive bias voltage, when applied to the global wordline (e.g., at operation 530 of FIG. 5), can increase the transition time and decrease the number of potential bit errors.

In response to determining that the temperature of the memory device does not satisfy the threshold condition (e.g., the temperature of the memory device is less than the threshold temperature), this means that the memory device is at a sufficiently cold temperature to that can cause a sufficiently slow transition from the transient state to the stable state (i.e., sufficient long transition time), which can lead to fewer potential bit errors. Since it is not necessary to apply a positive bias voltage to decrease the transition speed, at operation 640B, a ground bias voltage is selected. For example, control logic can select the ground bias voltage (0 V) to be applied to the global wordline. The ground bias voltage, when applied to the global wordline (e.g., at operation 530 of FIG. 5), may not affect the transition time from the transient state to the stable state. However, applying the ground bias voltage to the global wordline can prevent erase state (e.g., L0) charge gain that can occur when applying the positive bias voltage to the global wordline. Further details regarding operations 610B-640B are described above with reference to FIGS. 1A and 3-5.

Figure 7:
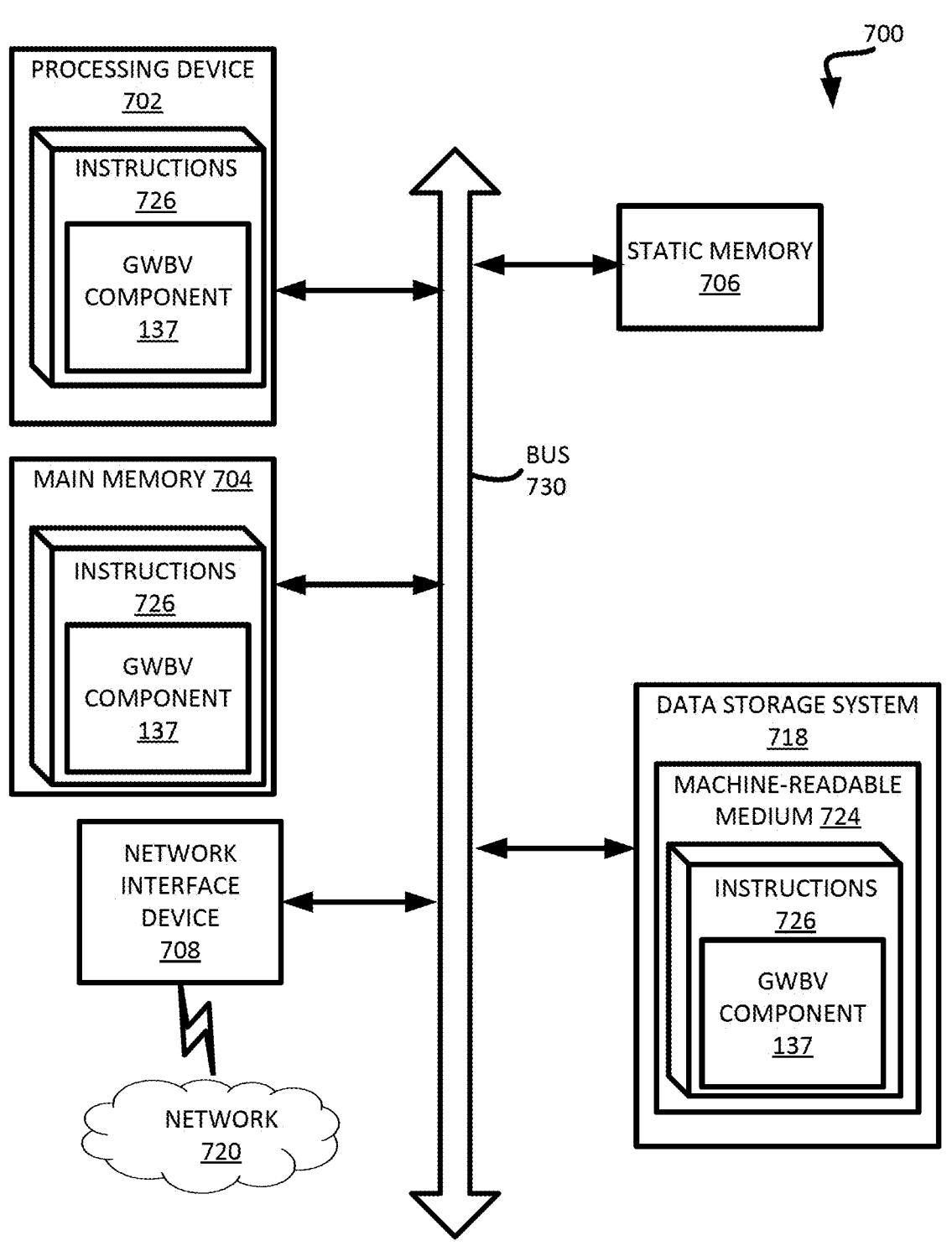
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the GWBV component 137 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 602 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1A.

In one embodiment, the instructions 726 include instructions to implement functionality corresponding to a GWBV component (e.g., the GWBV component 137 of FIG. 1A). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array; and
control logic, operatively coupled to the memory array, to perform operations comprising:
identifying a set of parameters related to the memory device;
selecting, based on the set of parameters, a magnitude of a bias voltage to be applied to a global wordline during a read state transition of a block of the memory device from a transient state to a stable state; and
causing the bias voltage to be applied to the global wordline.

2. The memory device of claim 1, wherein the set of parameters comprises a standby time corresponding to an amount of time from when the memory device has been accessed.

3. The memory device of claim 1, wherein the set of parameters comprises a temperature of the memory device, and wherein the magnitude of the bias voltage is proportional to the temperature of the memory device.

4. The memory device of claim 3, wherein the magnitude of the bias voltage is selected based on a temperature compensation value and a magnitude of a base bias voltage applied to the global wordline when the temperature is about 0° C.

5. The memory device of claim 3, wherein selecting the magnitude of the bias voltage to be applied to the global wordline comprises determining whether the temperature of the memory device satisfies a threshold condition.

6. The memory device of claim 5, wherein the operations further comprise: in response to determining that the temperature of the memory device satisfies the threshold condition, selecting a positive bias voltage to be applied to the global wordline.

7. The memory device of claim 5, wherein the operations further comprise: in response to determining that the temperature of the memory device does not satisfy the threshold condition, selecting a ground bias voltage to be applied to the global wordline.

8. A method comprising:
   identifying, by a processing device a set of parameters related to a memory device;
   selecting, by the processing device based on the set of parameters, a magnitude of a bias
voltage to be applied to a global wordline during a read state transition of a block of the memory device from a transient state to a stable state; and
   causing, by the processing device, the bias voltage to be applied to the global wordline.

9. The method of claim 8, wherein the set of parameters comprises a standby time corresponding to an amount of time from when the memory device has been accessed.

10. The method of claim 8, wherein the set of parameters comprises a temperature of the memory device, and wherein the magnitude of the bias voltage is proportional to the temperature of the memory device.

11. The method of claim 10, wherein the magnitude of the bias voltage is selected based on a temperature compensation value and a magnitude of a base bias voltage applied to the global wordline when the temperature is about 0° C.

12. The method of claim 10, wherein selecting the magnitude of the bias voltage to be applied to the global wordline comprises determining whether the temperature of the memory device satisfies a threshold condition.

13. The method of claim 12, further comprising: in response to determining that the temperature of the memory device satisfies the threshold condition, selecting, by the processing device, a positive bias voltage to be applied to the global wordline.

14. The method of claim 13, further comprising: in response to determining that the temperature of the memory device does not satisfy the threshold condition, selecting, by the processing device, a ground bias voltage to be applied to the global wordline.

15. A non-transitory computer-readable storage medium comprising instructions that, when executed by a processing device, cause the processing device to perform operations comprising:
   obtaining a temperature of a memory device;
   selecting a magnitude of a bias voltage, proportional to the temperature, to be applied to a global wordline during a read state transition of a block of the memory device from a transient state to a stable state; and
   causing the bias voltage to be applied to the global wordline.

16. The non-transitory computer-readable storage medium of claim 15, wherein the magnitude of the bias voltage is further selected based on a standby time corresponding to an amount of time from when the memory device has been accessed.

17. The non-transitory computer-readable storage medium of claim 15, wherein the magnitude of the bias voltage is determined based on a temperature compensation value and a magnitude of a base bias voltage applied to the global wordline when the temperature is about 0° C.

18. The non-transitory computer-readable storage medium of claim 15, wherein selecting the magnitude of the bias voltage to be applied to the global wordline comprises determining whether the temperature of the memory device satisfies a threshold condition.

19. The non-transitory computer-readable storage medium of claim 18, wherein the operations further comprise: in response to determining that the temperature of the memory device satisfies the threshold condition, selecting a positive bias voltage to be applied to the global wordline.

20. The non-transitory computer-readable storage medium of claim 18, wherein the operations further comprise: in response to determining that the temperature of the memory device does not satisfy the threshold condition, selecting a ground bias voltage to be applied to the global wordline.

* * * * *